US012748347B2

(12) United States Patent
Rhinow

(10) Patent No.: US 12,748,347 B2
(45) Date of Patent: Sep. 29, 2026

(54) END POINT DETERMINATION BY MEANS OF CONTRAST GAS

(71) Applicant: Carl Zeiss SMT GmbH, Oberkochen (DE)

(72) Inventor: Daniel Rhinow, Frankfurt am Main (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 555 days.

(21) Appl. No.: 18/212,768

(22) Filed: Jun. 22, 2023

(65) Prior Publication Data

US 2023/0341766 A1 Oct. 26, 2023

Related U.S. Application Data

(63) Continuation of application No. PCT/EP2021/085295, filed on Dec. 10, 2021.

(30) Foreign Application Priority Data

Dec. 22, 2020 (DE) ......................... 102020216518.1

(51) Int. Cl.

*G03F 1/74* (2012.01)
*H01J 37/30* (2006.01)
*H01J 37/305* (2006.01)

(52) U.S. Cl.

CPC ............ *G03F 1/74* (2013.01); *H01J 37/3056* (2013.01); *H01J 2237/006* (2013.01); *H01J 2237/30466* (2013.01); *H01J 2237/31744* (2013.01)

(58) Field of Classification Search

CPC ... G03F 1/74; H01J 37/3056; H01J 2237/006; H01J 2237/31744

See application file for complete search history.

(56) References Cited

U.S. PATENT DOCUMENTS 6,593,040 B2 7/2003 Smith
8,691,700 B2 4/2014 Hautala et al.

(Continued)

FOREIGN PATENT DOCUMENTS

| | | | |
|---|---|---|---|
| CN | 102360167 | 1/2015 | ............... G03F 9/00 |
| DE | 102013203995 | 9/2014 | ........... H01L 21/027 |

(Continued)

OTHER PUBLICATIONS

Office Action issued by the German Patent Office for Application No. DE 10 2020 216 518.1, dated Jun. 2, 2021 (with English Translation).

(Continued)

*Primary Examiner* — Nicole M Ippolito

(74) *Attorney, Agent, or Firm* — Fish & Richardson P.C.

(57) ABSTRACT

The present invention encompasses a method of repairing a defect on a lithography mask, comprising the following steps: (a.) directing a particle beam onto the defect to induce a local etching operation on the defect; (b.) monitoring the etching operation using backscattered particles and/or secondary particles and/or another free-space signal generated by the etching operation, in order to detect a transition from the local etching operation on the defect to a local etching operation on an element of the mask beneath the defect, and (c.) feeding in at least one contrast gas in order to increase contrast in the detection of the transition.

20 Claims, 5 Drawing Sheets

(56) References Cited

U.S. PATENT DOCUMENTS

| | | | | |
|---|---|---|---|---|
| 2003/0047691 | A1 | 3/2003 | Musil et al. | |
| 2004/0033425 | A1 | 2/2004 | Koops et al. | |
| 2004/0121069 | A1 | 6/2004 | Ferranti et al. | |
| 2004/0262518 | A1 | 12/2004 | Lu et al. | |
| 2006/0187432 | A1 | 8/2006 | Yasuda et al. | |
| 2006/0261036 | A1 | 11/2006 | Fazio et al. | |
| 2009/0032723 | A1 | 2/2009 | Fukaya et al. | |
| 2010/0197142 | A1 | 8/2010 | Randolph et al. | |
| 2011/0197657 | A1 * | 8/2011 | Gole | G01N 27/127 438/49 |
| 2013/0084707 | A1 | 4/2013 | Hashimoto et al. | |
| 2013/0306101 | A1 | 11/2013 | Swanson et al. | |
| 2014/0255831 | A1 | 9/2014 | Hofmann et al. | |
| 2014/0299577 | A1 * | 10/2014 | Chung | H01J 37/32981 118/712 |
| 2015/0011088 | A1 * | 1/2015 | McNie | H01J 37/32917 216/60 |
| 2016/0299103 | A1 | 10/2016 | Saleh et al. | |
| 2018/0259848 | A1 | 9/2018 | Grimbergen et al. | |

FOREIGN PATENT DOCUMENTS

| | | | | |
|---|---|---|---|---|
| DE | 102019209392 | | 7/2020 | G01M 11/00 |
| JP | 2003-328161 | | 11/2003 | |
| JP | 2005044843 | A | 2/2005 | |
| JP | 2005-260057 | | 9/2005 | |
| JP | 2009-037804 | | 2/2009 | |
| JP | 2009-212274 | A | 9/2009 | |
| JP | 2015-034909 | | 2/2015 | |
| JP | 2020-510311 | A | 4/2020 | |
| TW | 201530602 | | 8/2015 | H01J 37/02 |
| TW | I632002 | | 8/2018 | H01L 21/304 |
| WO | WO-2022268924 | A1 * | 12/2022 | G03F 1/78 |

OTHER PUBLICATIONS

Office Action and Search Report issued by the Taiwan Patent Office for Application No. TW 110147002 dated Oct. 6, 2022 (with English Translation).

International Search Report for International Application No. PCT/EP2021/085295, dated Apr. 14, 2022 (with English Translation).

Stanishevsky et al., "Testing new chemistries for mask repair with focused ion beam gas assisted etching", *Journal of Vacuum Science and Technology*, vol. 21, No. 6, pp. 3067-3071 (2003).

Office Action issued by the Korean Patent Office for Application No. KR 10-2023-7024825, dated Apr. 29, 2025 (English Translation Only).

Office Action issued by the Japanese Patent Office for Application No. JP 2023-538733, dated Jun. 3, 2024 (with English Translation).

Notice of Allowance in Korean Appln. No. 10-2023-7024825, mailed on Jan. 9, 2026, 4 pages (with English translation).

Office Action in European Appln. No. 21839362, mailed on May 4, 2026, 16 pages (with English translation).

Office Action and Search Report in Chinese Appln. No. 202180087077.5, mailed on May 23, 2026, 19 pages (with English translation).

* cited by examiner

END POINT DETERMINATION BY MEANS OF CONTRAST GAS

CROSS-REFERENCE TO RELATED APPLICATIONS

This application is a continuation of and claims priority under 35 U.S.C. § 120 from PCT Application No. PCT/EP2021/085295, filed on Dec. 10, 2021, which claims priority from German Application No. 10 2020 216 518.1, filed on Dec. 22, 2020. The entire contents of each of these priority applications are incorporated herein by reference.

TECHNICAL FIELD

The present invention relates to a method, an apparatus and a computer program for repairing a defect in a lithography mask by use of a particle beam.

BACKGROUND

As a consequence of the steady increase in integration density in microelectronics, lithography masks (often just "masks" for short hereinafter) have to image ever smaller structure elements into a photoresist layer of a wafer. In order to meet these requirements, the exposure wavelength is being shifted to ever shorter wavelengths. At the present time, mainly argon fluoride (ArF) excimer lasers are being used for exposure purposes, these lasers emitting light at a wavelength of 193 nm. Intensive work is being done on light sources which emit in the extreme ultraviolet (EUV) wavelength range (10 nm to 15 nm), and corresponding EUV masks. The resolution capability of wafer exposure processes has been increased by simultaneous development of multiple variants of conventional binary lithography masks. Examples thereof are phase masks or phase-shifting masks and masks for multiple exposure.

On account of the ever decreasing dimensions of the structure elements, lithography masks cannot always be produced without defects that are printable or visible on a wafer. Owing to the costly production of masks, defective masks are repaired whenever possible.

Two important groups of defects of lithography masks are, firstly, dark defects and, secondly, clear defects.

Dark defects are locations at which absorber material and/or phase-shifting material is present, but which should be free of this material. These defects are repaired by removing the excess material preferably with the aid of a local etching operation.

By contrast, clear defects are defects on the mask which, on optical exposure in a wafer stepper or wafer scanner, have greater transmittance than an identical defect-free reference position. In mask repair processes, such clear defects can be eliminated by depositing a material having suitable optical properties. Ideally, the optical properties of the material used for the repair should correspond to those of the absorber or phase shifting material.

A method of removing dark defects is to use an electron beam directed directly onto the defect to be repaired (exposure). On account of the use of electron beam, in particular, precise steering and positioning of the beam onto the defect is possible. In conjunction with a precursor gas, also called process gas, which may either be present in the atmosphere of the mask to be repaired or adsorbed on the mask itself, it is possible to induce a reaction akin to a local etching operation by virtue of the incident electron beam. This induced local etching operation can remove fractions of excess material (of the defect) from a mask, such that the absorber properties and/or phase-shifting properties desired for the lithography mask can be generated or restored.

Alternatively, it is also possible to choose the precursor gas used such that a deposition process can be induced on exposure to the beam. As a result, it is possible to deposit additional material on clear defects in order to locally reduce the transmittance of the mask and/or to increase the phase-shifting properties.

The masks to be repaired may generally have a multilayer structure, composed of at least two materials typically disposed one on top of another. It is possible here for the upper material (the material facing the electron beam) to function as absorber material, as phase-shifting material or as defect material, and for the lower material to function as substrate or carrier material (or as the material of an element beneath the defect) of the lithography mask to be repaired.

In the case of interaction of the electron beam or of another particle beam used for etching or deposition with the precursor gas or a material of the defect, there may be backscatter of electrons or of the particles. For example, backscattered electrons may be detected in parallel to the etching and/or deposition process, which leads to a signal of backscattered electrons (for example EsB signal; EsB: energy-selective backscattering). Additionally or alternatively, it is also possible to generate secondary particles, for example electrons, through the process of interaction of particle beam and the precursor gas or the material of the defect. For example, secondary electrons may lead to a secondary electron signal (SE signal) that can likewise be detected in parallel with the etching or deposition process. By detecting the particles mentioned or signals generated thereby during the etching operation and/or the deposition operation, it is possible to monitor the progress of the repair operation.

More particularly, correct and precise detection of the transition from the etching operation on the material of the defect to the material of the element beneath the defect is of crucial significance for the success of the repair operation. This is also referred to as endpointing. Precise endpointing can ultimately ensure that the mask to be repaired, after the etching operation has ended, has the desired absorption properties and/or phase-shifting properties and, for example, the substrate material beneath the defect material is not attacked and/or removed by the etching operation. On account of the high precision of demands made on a wafer structure in the semiconductor industry, correspondingly analogous stringent demands are made on the repair of a lithography mask.

By means of the monitoring of the etching operation by detecting the backscattered and/or secondary particles formed during the etching operation (on the material to be etched), it is possible to obtain a kind of real-time image of the etching operation. It is thus possible for a transition of the etching operation between the materials to be determined by a changing contrast of the particle beams mentioned. However, this contrast can be greatly attenuated in some cases, for example when the materials present in the etching operation differ only slightly (for example have a similar atomic number), such that exact determination of the endpoint (transition of the etching operation from material of the defect to the material of the element beneath the defect) is impossible.

Various approaches are known for achieving precise results in spite of this problem:

US 2004/0121069 A1 discloses a method of repairing phase-shifting photomasks by means of a charged particle beam system. Topographic data from a scanning electron microscope are used here as substitute for endpointing. The topographic data can be utilized to adjust the dose of the charged particle beam for every point within the defect environment, based on the elevation and surface slope at the specific point.

U.S. Pat. No. 6,593,040 B2 discloses a method and an apparatus for correction of phase-shift defects in a photomask. This comprises scanning of the photomask and three-dimensional analysis of the defect with an AFM (atomic force microscope). Based on the three-dimensional analysis, an etch map is created and a focused ion beam (FIB) is controlled in accordance with the etch map in order to remove the defect. In order to give higher accuracy of the repair process, test specimens of the FIB are produced and analyzed three-dimensionally.

However, these approaches are time-consuming and complex. Moreover, the etch rate cannot always be predicted precisely, and so, in spite of the effort and complexity, it is by no means always possible to give optimal results.

The problem addressed is therefore that of further improving etching operations on defects.

SUMMARY

The abovementioned object is at least partly achieved by the various aspects of the present invention, as described below.

The present application claims the priority of German patent application DE 10 2020 216 518.1, which is hereby incorporated by reference.

One embodiment may comprise a method of repairing a defect on a lithography mask. In this method, (a.) a particle beam may be directed onto the defect to be repaired to induce a local etching operation on the defect. The etching operation can be monitored (b.) using backscattered and/or secondary particles and/or another free-space signal generated by the etching operation, in order to detect a transition from the local etching operation on the defect to a local etching operation on an element of the mask beneath the defect. In addition, (c.) at least one contrast gas can be fed in in order to increase contrast in the detection of the transition.

The inventors of the present invention have recognized that the detection of the transition can be crucially improved by feeding in a contrast gas (into the atmosphere surrounding the mask to be repaired). This may be helpful especially in situations in which the signal used for the detection of the transition (backscattered particles, secondary particles and/or another free-space signal generated by the etching operation; in principle, all other types of signal suitable in principle for detection of the transition are also conceivable; hereinafter, for the sake of simplicity, reference is always made to a free-space signal) changes to a degree that can be detected only with difficulty or is undetectable at the transition. Specifically in such situations, a contrast gas that influences the generation of the signal on a material of the defect or a material of the element beneath to different degrees can contribute to a particularly high relative increase in contrast. More particularly, it has been found that this effect can be achieved to a significant degree without significantly disrupting the etching operation. The endpoint of the etching operation can thus be ascertained reliably without any need for iterative methods or particularly complex measurement apparatus.

For example, in the context of EsB endpointing, it is desirable that a grey shade difference of at least 10 is achieved, for example a total of 256 grey shades are used, in order to be able to ensure precise determination of the endpoint. It is possible here in principle, for example depending on the detector system used (which may comprise both hardware and software components), also to obtain different necessary grey shade differences. In the case of a change in the number of possible grey shades, a correspondingly altered grey shade difference other than 10 may be considered in order to be able to perform endpointing. The grey shade difference may relate here to the ratio of a signal strength of backscattered electrons that are produced when the material of the defect is removed and a signal strength which is generated when the particle beam hits a material beneath the defect. However, the endpointing is not limited to the EsB endpointing described here, but can also be effected using different mechanisms that lead, for example, to backscatter and/or generation of secondary electrons, such that a transition from the processing (e.g. removal) of a first material to a second material can be detected precisely, as described in general terms herein. The corresponding endpoint determination in processes other than the EsB endpointing described here can also be effected using the abovementioned differences in grey shades, and a grey shade difference of 10, in the case of 256 possible grey stages, should be regarded merely as an illustrative guide value.

Especially also in the case of only slight differences in the atomic number of the materials involved, endpointing can be improved by feeding in a contrast gas. The contrast gas may be chosen here, for example, in a material-dependent and/or application-specific manner. This enables much more precise and reliable determination of the endpoint of an etching operation and hence more precise repair of defects in a lithography mask without having to accept disadvantageous throughput losses or a disadvantageous effect of the etching operation itself.

The particles of the particle beam may, for example, be electrons, protons, ions, atoms, molecules, photons etc.

For example, the contrast gas may be selected such that an adsorption rate and/or dwell time of the contrast gas on a material of the element beneath the defect (often also mask material hereinafter) (at least on time average) is higher than an adsorption rate or dwell time of the contrast gas on a material of the defect (defect material). This may be accompanied by the desired requirement that the contrast gas is preferentially and/or more quickly adsorbed on and/or dwells for longer on the material of the element beneath the defect (compared to a material of the defect). There may be various reasons for the preferred absorption of the contrast gas on the mask material. For instance, it is possible that the contrast gas shows a longer dwell time on the mask material through physisorption than on the material of the defect. It is equally and alternatively possible that the contrast has a longer dwell time on account of chemisorption on the mask material than on the defect material.

By virtue of this preferred adsorption, it is possible to ensure higher contrast to a higher influence on the signals generated via the contrast gas itself and/or via a stronger interaction of the contrast gas with the second material. For example, this can generate a stronger contrast for the mask material in the EsB or SE signal (or another suitable signal). Contrast gas adsorbed on the surface of the mask may give a stronger or weaker EsB signal compared to the defect material and/or a stronger or weaker SE signal.

The contrast gas used may generally be chosen such that it has a lower affinity for a material of the defect than for a material of the element beneath the defect. This can ensure that, firstly, there is a clearer relative increase in contrast since, on account of a preferred adsorption of the contrast gas on the element beneath the defect, the signal generated there for detection of the transition is correspondingly influenced to a greater degree than on the material of the defect. Secondly, this can also enable minimum disruption of the etching operation since the particle beam only hits the contrast gas to an increased degree when the local etching operation on the defect is already over.

Alternatively or additionally, it is also possible that the contrast gas is chosen such that it has a lower affinity (adsorption rate and/or dwell time) for a material of the defect than a precursor gas used for the etching operation. Alternatively or additionally, it is also possible that the contrast gas is selected such that it has a higher affinity (adsorption rate and/or dwell time) for a material of the element beneath the defect than a precursor gas used for the etching operation.

More particularly, the contrast gas can thus be selected in a material-dependent and application-based manner.

In addition, the contrast gas can be selected such that the extent to which it influences the backscatter of particles and/or generation of secondary particles and/or the other free-space signal generated by the etching operation on a material of the defect is different from that on a material of the element beneath. For instance, the characteristics of the contrast gas may be such that it, by virtue of its presence, leads to different properties with regard to the detectable backscattered particles and/or secondary particles and/or the other free-space signal by comparison with the mask material and/or the material of the defect. By virtue of presence and/or adsorption of the contrast gas on the defect material and/or mask material, it is possible to influence the natural properties of the defect material and/or mask material with regard to backscattered and/or secondary particles and/or the other free-space signal, such that the characteristics that lead to detection of these particles can vary depending on the contrast gas used. For example, the contrast gas adsorbed on the surface of the mask material can attenuate the signal of backscattered particles and/or secondary particles and/or of the other free-space beam that emanates from the mask material.

It is also possible to select the contrast gas such that incidence of the particle beam on the contrast gas gives rise to additional backscatter of particles and/or generation of secondary particles or an additional other free-space signal.

In one possible embodiment, the contrast gas may be an inert gas, for example a noble gas. This can contribute to avoiding a (disadvantageous) influence of the contrast gas on the duration and quality of the etching operation. The contrast gas may likewise be a gas having potential reactivity that has barely any effect or no material effect on the success of the etching process, regardless of whether it is an inert gas or not.

The contrast gas can be fed in in at least two separate intervals. The contrast gas is thus not fed in just once (in a high dose), but can also be refreshed at intervals (in a lower dose). Furthermore, it is possible to feed in the contrast gas in a multitude of intervals during the etching operation (chopping). For example, it is possible to react to dynamic changes in the etching operation. It can be ensured that there is always a sufficient concentration of the contrast gas present, but that an overdose of the contrast gas is avoided. The latter may likewise be advantageous for avoiding adverse effects on the etching operation resulting from the presence of the contrast gas.

The chopping may also be described by, for example, two or more characterizing periods. Firstly, this may be the time interval in which the gas can flow in. Secondly, this may be the subsequent time interval in which no gas flows in. This can be described by way of example as an opening time of a valve connected to a reservoir of a precursor gas (or contrast gas), and through which this can reach the reaction site, and a time in which the valve remains in a closed state. Typical time ratios of the open valve and closed valve may be 1:10 (valve, for example, open for 1 second, closed for 10 seconds), 1:30 or 1:60, although it is also possible in principle to use different ratios.

The contrast gas can be fed in after the etching operation has commenced, preferably only shortly before the expected transition from the etching operation on the defect to the etching operation on the element of the mask beneath the defect. This can further reduce any disruption of the etching operation by the contrast gas.

It is also possible to induce the local etching operation in absence of the contrast gas. It may additionally be envisaged that the contrast gas is fed in only after a predetermined expected progression of etching has been attained. Regardless of that, it may be the case that monitoring of the etching operation is initiated only after the contrast gas has been fed in. It may be the case here that two or all three of the latter method steps are executed. Alternatively, by contrast, it is also possible to execute merely individual method steps among the latter (for example to initiate the monitoring of the etching operation only after the contrast gas has been fed in).

A predetermined progression of etching may relate, for example, to a progression of etching of, for example, 25%, 50%, 75%, 90% or any other magnitude; a progression of etching of 100% may be associated with a progression of etching where the etching operation transitions from etching of the defect to etching of the element beneath the defect. The etching operation and/or progression of etching can be monitored either in the presence of an operator (for example as visual endpointing) or in a fully automated manner.

Induction of the etching operation may be preceded, for example, by calibration of a lookup table. The lookup table can be used, for example, to predetermine the progression of etching, for example, as a function of time, as a function of loops, etc. On attainment of the predetermined expected progression of etching, the contrast gas can then be fed in. The predetermined progression of etching can be ascertained, for example using the lookup table, specifically for the etching parameters used (beam parameters, precursor gas, material to be etched, etc.). Alternatively or additionally to the calibrating of a lookup table, it is also possible, for example, to read out a lookup table from a memory that relates to etching parameters corresponding or at least approximating to those of an etching operation to be undertaken at that moment. Such a lookup table may likewise be used as described herein. The use of a predetermined expected progression of etching, especially in the case of a homogeneous defect composition, may enable precise estimation of the progression of etching since the etching process in this case may be essentially a linear process (for example equal progression of etching may be achieved within the same time intervals).

For the induction of the etching operation, the atmosphere for the etching operation may also be supplied with a precursor gas for the etching operation, which, interacting with the incident particle beam, ultimately leads to an etching reaction and removal of the defect material. The process can proceed in such a time sequence that the contrast gas is fed in only after the precursor gas has been fed in. This can also contribute to further reduction in any disruption of the etching operation by the contrast gas. In this way, for example, the defect material can preferably be covered by the precursor gas. It is likewise possible, by contrast, that the two gases are simultaneously fed into the atmosphere in which the etching operation proceeds. It is likewise conceivable, if appropriate, to feed the contrast gas to the atmosphere of the etching operation prior to the precursor gas.

It is possible that the precursor gas influences the backscatter of particles and/or generation of secondary particles and/or the other free-space signal on a material of the defect and/or on a material of the element beneath.

The contrast gas may be selected such that it displaces the precursor gas on a material of the element beneath the defect material, preferably displaces it more strongly than on a material of the defect. This can especially ensure that sufficient adsorption of contrast gas on the mask material is always possible, and hence early recognition of a transition of the etching of the defect material to etching of the material of the element beneath. At the same time, the lower displacement of the precursor gas on the defect material can in turn minimize the disruption of the etching process.

A useful contrast gas here may be one or more oxidants, for example $O_2$, $O_3$, $H_2O$, $H_2O_2$, $N_2O$, NO, $NO_2$, $HNO_3$ and/or other oxygenous gases. It is likewise possible to use one or more halides, for example $Cl_2$, HCl, $XeF_2$, HF, $I_2$, HI, $Br_2$, HBr, NOCl, $NF_3$, $PCl_3$, $PCl_5$, $PF_3$ and/or other halogen-containing gases. $Cl_2$ may be regarded as a preferred contrast gas, since it interferes only slightly with the local etching operation and lowers the work function (which can lead to a higher SE signal). Useful contrast gases may likewise include gases having reducing action, for example $H_2$, $NH_3$, $CH_4$, $H_2S$, $H_2Se$, $H_2Te$ and other hydrogen-containing gases. It is likewise possible to use gaseous alkali metals (for example Li, Na, K, Rb, Cs) as contrast gas, or to use components of a plasma (preferably of a remote plasma generated separately from the sample). Furthermore, it is also possible to use noble gases (for example He, Ne, Ar, Kr, Xe). A further option is the use of surface-active substances (for example alkyl hydroxides, aliphatic carboxylic acids, mercaptoalkanes, alkylamines, alkyl sulfates, alkyl phosphates, alkyl phosphonates, and it is also possible to use aromatic and other organic compounds instead of alkyl compounds). It should also be pointed out that the contrast gases mentioned may also be used as precursor gases.

Useful precursor gases may be one or more (metal, transition element, main group) alkyls, for example cyclopentadienyl (Cp)- or methylcyclopentadienyl (MeCp)-trimethylplatinum ($CpPtMe_3$ and/or $MeCpPtMe_3$), tetramethyltin $SnMe_4$, trimethylgallium $GaMe_3$, ferrocene $Cp_2Fe$, bisarylchromium $Ar_2Cr$, dicyclopentadienylruthenium $Ru(C_5H_5)_2$ and other compounds of this kind. It is likewise possible to use one or more (metal, transition element, main group) carbonyls, for example chromium hexacarbonyl $Cr(CO)_6$, molybdenum hexacarbonyl $Mo(CO)_6$, tungsten hexacarbonyl $W(CO)_6$, dicobalt octacarbonyl $Co_2(CO)_8$, triruthenium dodecacarbonyl $Ru_3(CO)_{12}$, iron pentacarbonyl $Fe(CO)_5$ and/or other compounds of this kind. It is likewise possible to use one or more (metal, transition element, main group) alkoxides, for example tetraethoxysilane $Si(OC_2H_5)_4$, tetraisopropoxytitanium $Ti(OC_3H_7)_4$ and other compounds of this kind. Moreover, it is also possible to use one or more (metal, transition element, main group) halides, for example $WF_6$, $WCl_6$, $TiCl_6$, $BCl_3$, $SiCl_4$ and/or other compounds of this kind. It is also likewise possible to use one or more (metal, transition element, main group) complexes, for example, copper bis(hexafluoroacetylacetonate) $Cu(C_5F_6HO_2)_2$, dimethylgold trifluoroacetylacetonate $Me_2Au(C_5F_3H_4O_2)$ and/or other compounds of this kind. In addition, it is possible to use organic compounds such as CO, $CO_2$, aliphatic or aromatic hydrocarbons, constituents of vacuum pump oils, volatile organic compounds and/or other compounds of this kind. It should also be pointed out that it is also conceivable to use the precursor gases listed as contrast gases.

The person skilled in the art is able to see here that the above lists are not exhaustive, and that any desired combinations of the selection of possible contrast gases and precursor gases cited here merely by way of example are also possible, including beyond the selection cited.

In a preferred working example, there is a combination of a contrast gas having an opposite influence on the EsB/SE signal (or a different signal used) with respect to the influence of the precursor gas. The influence here relates to the material to be etched and the material not to be etched. In this case, it is possible, for example, for the adsorbed precursor gas to lower the work function of the material (higher SE signal), whereas the contrast gas can increase the work function (lower SE signal), or vice versa.

It should be noted that, rather than feeding in the contrast gas (for example after commencement of the etching operation), it may also already be present (in low concentration), and then its concentration may merely be increased in a directed manner (for example after commencement of the etching operation and before the expected end thereof).

After the transition of the etching operation has been detected, the etching operation can then be stopped in order to prevent unwanted etching of the mask material beneath the defect material. For example, this can be effected by stopping the particle beam.

Furthermore, it is likewise possible to implement the process described herein as a computer program. This may be a computer program with instructions which, on execution, cause a computer to conduct a method having one or more of the method steps set out herein.

The repair of a defect on a lithography mask may also be executed by an apparatus that may comprise (a.) means of directing a particle beam onto the defect. The apparatus may further comprise (b.) means of monitoring the etching operation using backscattered particles and/or secondary particles and/or another free-space signal generated by the etching operation, in order to be able to detect a transition from the etching operation on the defect to an etching operation on an element of the mask beneath the defect. Finally, the apparatus may comprise (c.) means of feeding in at least one contrast gas in order to be able to increase contrast in the detection of the transition.

The apparatus may further include means set up to execute the steps described herein in relation to methods.

An apparatus for repairing a defect in a lithography mask may also be set up such that it comprises the above-described computer program and, in accordance with the instructions therein, causes the apparatus to execute one or more of the above-described method steps.

BRIEF DESCRIPTION OF DRAWINGS

The following detailed description describes possible embodiments of the invention, with reference being made to the following figures.

DETAILED DESCRIPTION

There follows a description of embodiments of the present invention, primarily with reference to the repair of a lithography mask, especially masks for microlithography. However, the invention is not limited thereto and it may also be used for other kinds of mask processing, or more generally for surface treatment in general, for example of other objects used in the field of microelectronics, for example for modification and/or repair of structured wafer surfaces or of surfaces of microchips, etc. For example, it is possible to repair a defect generally assigned to a surface or above an element of a surface. Even if reference is therefore made hereinafter to the application of processing a mask surface, in order to keep the description clear and more easily understandable, the person skilled in the art will keep the other possible uses of the teaching disclosed in mind.

It is also pointed out that only individual embodiments of the invention are described in more detail hereinafter. However, a person skilled in the art will appreciate that the features and modification options described in association with these embodiments can also be modified even further and/or can be combined with one another in other combinations or sub-combination without this leading away from the scope of the present invention. Moreover, individual features or sub-features can also be omitted provided that they are dispensable in respect of achieving the intended result. In order to avoid unnecessary repetition, reference is therefore made to the remarks and explanations in the preceding sections, which also retain their validity for the detailed description which now follows below.

Figure 1A:
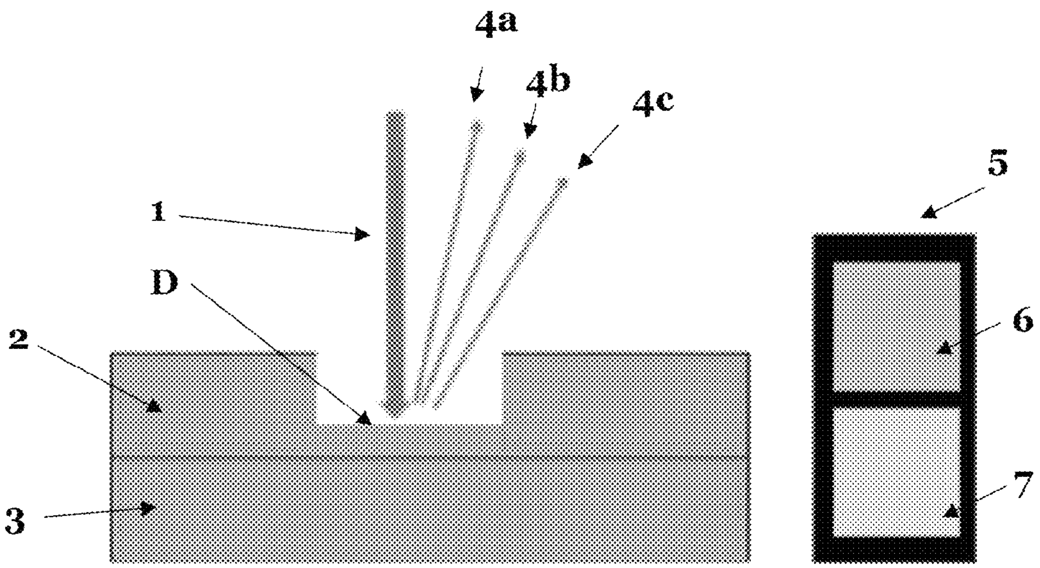
FIGS. 1A-1B example of endpointing in the absence of a contrast gas.

FIG. 1A shows a schematic of a conventional method of endpointing using an etching operation induced by a beam of charged particles, as used for repair of lithography masks. A beam of particles 1, for example electrons, although other charged particles may also be used, may be guided here onto a first material 2. This first material 2 may have or be a dark defect D. This may be associated with the consequence of creation of unwanted absorption characteristics or an unwanted phase shift at the site of the defect for transmitting light, as employed, for example, for the production of wafers in the semiconductor industry. It is therefore the aim of a repair method to correspondingly remove this excess material. The first material 2 may be applied here to a second material 3, with the second material 3 functioning as substrate or mask. Both materials may take the form of material layers, although other material arrangements are also possible. For example, the first material 2 may be in a locally bound arrangement atop a layer formed by the second material 3.

In order to remove the defect D in a desired manner, the surrounding, typically enclosed atmosphere may be supplied with a precursor gas (not shown here), which, interacting with the incident beam of charged particles 1, may lead to a local etching operation at the site of the incident particle beam. The incident beam of particles may be guided here systematically over the defect region by interaction with magnetic and/or electrical fields and/or another control method, which results in corresponding removal of the defect D. As a consequence of the interaction of the incident beam of charged particles 1, it is possible to obtain backscattered particles 4*a* and/or secondary particles 4*b* and/or another free-space beam 4*c* (even if the working example discussed hereinafter is limited to backscattered and/or secondary particles, any other type of particles/beams that permits conclusion as to the progress of the etching operation is advantageously utilizable analogously). These particles or this beam offer(s) the option of monitoring the etching operation. Since the first material 2 and the second material 3 may typically differ in their composition (for example with regard to their atomic number), there may be a change in the signal 5 detected from backscattered particles 6 and/or secondary particles 7 and/or the free-space beam. A change in the signal detected can enable the conclusion that the defect material D has been removed completely and the incident beam of charged particles is now interacting with the second material 3.

Figure 1B:
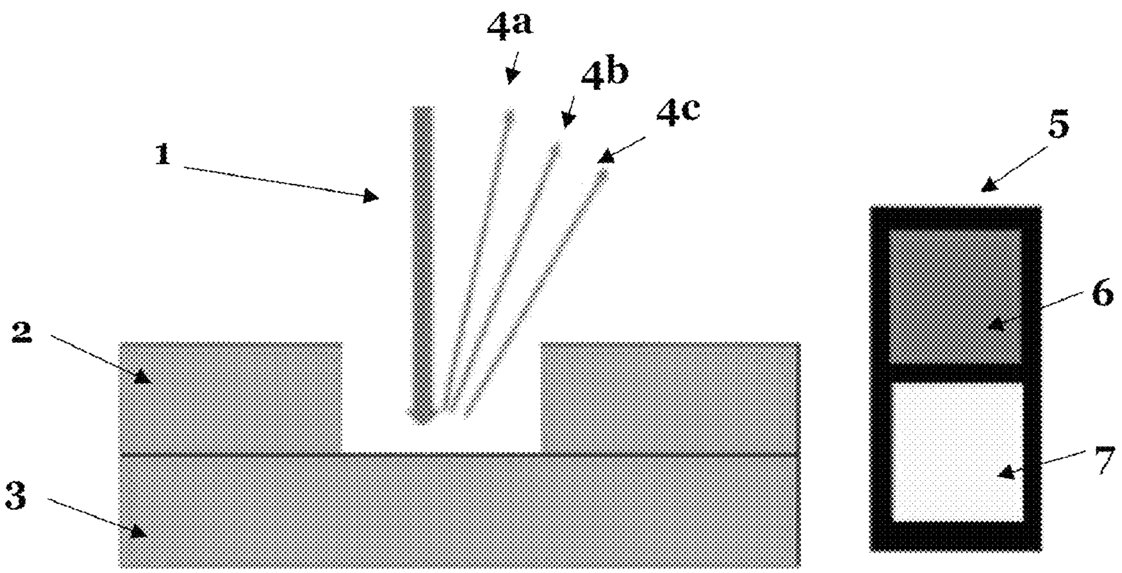

The scenario in which the defect D consisting of the first material 2 has been removed completely is shown by FIG. 1B. In this case, the charged beam 1 can directly hit the substrate material 3 and then no longer have any local interaction with the first material 2. This can lead to a change in the detectable signal 5 in such a way that the signals from backscattered particles and/or secondary particles are altered compared to the scenario shown in FIG. 1A. For example, the signal of backscattered particles may be increased. Alternatively or additionally, the signal resulting from secondary particles may be attenuated.

A known problem with the repair method on a lithography mask shown in FIGS. 1A and 1B arises particularly when the detectable signals, at the transition from the first to the second material, do not change or change in a manner which is undetectable or can be detected only with difficulty. In that case, the monitoring of the etching operation is possible only with difficulty. Precise determination of the endpoint, i.e. of the juncture at which the defect D, consisting, for example, of the first material 2, has been removed completely is thus possible only with very limited accuracy. The consequence of this could be that particle beam-induced etching operation also inadvertently removes parts of the second material 3 and, consequently, the absorption characteristics and/or phase shift characteristics of the mask are affected. This can occur especially when the two materials 2 and 3 have very similar interaction characteristics with the beam of charged particles 1.

This problem and this limitation have been recognized by the applicant and optimized in that, in accordance with the invention, the etching operation can be supplied with a contrast gas in order to be able to see the material transition during the etching of the first material 2 to the second material 3 with higher precision.

Figure 2A:
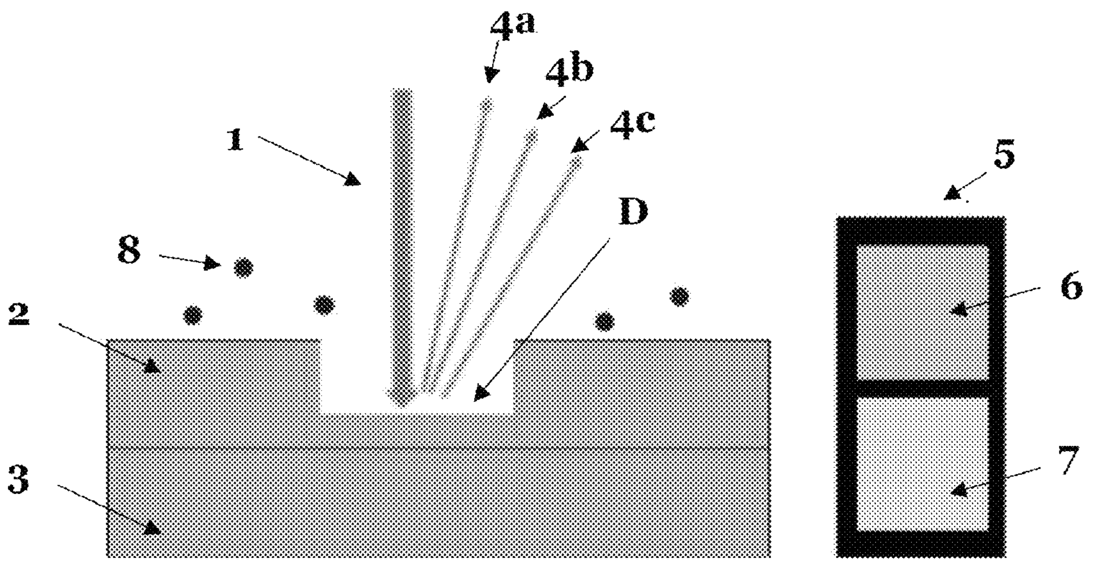
FIGS. 2A-2B example of endpointing using a contrast gas.

FIG. 2A shows an etching operation as usable for repair of a lithography mask. In addition to the method according to FIGS. 1A and 1B, the etching operation may be supplied with a contrast gas 8. This contrast gas 8 may be selected here such that it is adsorbed preferentially onto the second material 3. The particle beam 1, when it hits the defect D consisting of the first material 2, interacts primarily with the first material 2 and only to a lesser extent with the supplied contrast gas 8. The detectable signal intensities 6 and 7 during the etching operation on the first material 2 may thus at first be analogous to the working example described in FIG. 1A.

Figure 2B:
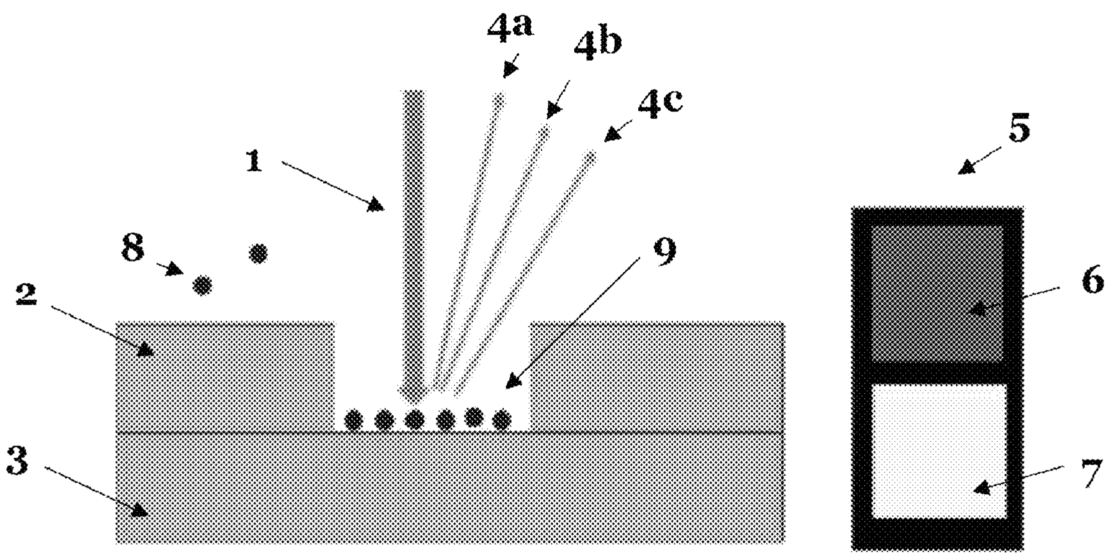

FIG. 2B shows the scenario in the case of complete removal of the defect D. Since, in this scenario, the second material 3 can be exposed to the contrast gas 8 supplied, and the contrast gas 8 can preferably be selected such that it is adsorbed preferentially onto the second material 3, the particle beam 1 does not directly hit the second material 3, but rather hits the gas particles of the contrast gas 8 adsorbed on the second material 3. The contrast gas 8 may have characteristics different from the second material 3 with regard to the production of backscattered particles 6 and or secondary particles 7, or at least change the characteristics of the second material 3 in this regard. This can lead to elevated contrast between the signals from backscattered and/or secondary particles that arise as a result of interaction of the particle beam 1 with the first material 2 or as a result of interaction with at the site 9 of the contrast gas 8 adsorbed on the second material 3. By way of example, FIG. 2B illustrates that the signal of backscattered particles 6 is increased, while the signal of secondary particles 7 is reduced. However, this is merely by way of example. In each case, it is also possible to detect only one of these signals and/or another free-space signal, and variances in the signal strength in either direction are conceivable.

In a preferred embodiment, induction of the local etching operation may be undertaken in the absence of the contrast gas.

Independently thereof, calibration of a lookup table may be envisaged. In a lookup table, parameters such as etch rate, etch time, number of cycles etc. may be associated with parameters of the particle beam 1 (e.g. power, acceleration voltage, particle type, etc.) and/or of the first material 2 and/or of the second material 3 and/or of the precursor gas and/or of the contrast gas. On this basis, for a particular etching operation, it may be made possible to predict the juncture of transition of the etching operation from the first material 2 to the second material 3 for various beams or etch parameters. What may be envisaged here is calibration of the lookup table both in the presence of the contrast gas and in the absence of the contrast gas.

In some embodiments, the calibration does not necessarily take place before every etching operation. This is because it may likewise be the case that the lookup table is stored in a storage medium and is based on historically recorded data or works parameters. On the basis of the calibrated lookup table and/or a stored lookup table, it is possible, for example, to predetermine the progression of etching to be expected over time with or without contrast gas.

Regardless of this, a contrast gas 8 can, for example, be supplied only when the etching progression has already advanced to a predetermined magnitude. The predetermined magnitude can be ascertained, for example, by use of a lookup table. The supply of the contrast gas only in the course of the etching process (for example toward the end thereof) may minimize any disruptive effects of the contrast gas 8 on the local etching operation. These may be manifested, for example, in a change in the etch rate and/or etch selectivity in the presence of the contrast gas compared to the absence of the contrast gas, which can possibly lead to incorrect predictions with regard to the progression of etching and/or reduction in the etch quality.

It is also possible that the etching operation is monitored only after the contrast gas has been fed in. In that case, the respective sensors, programs etc. must be active only after or on supply of the contrast gas.

Figure 3A:
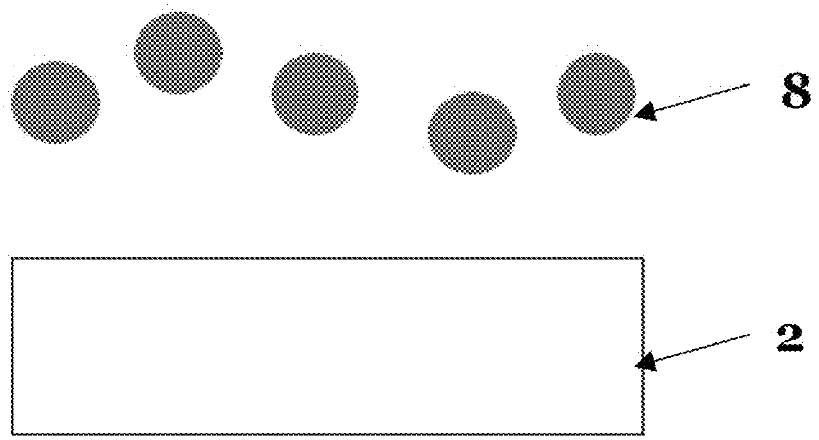
FIGS. 3A-3B example of adsorption characteristics of a contrast gas.
Figure 3B:
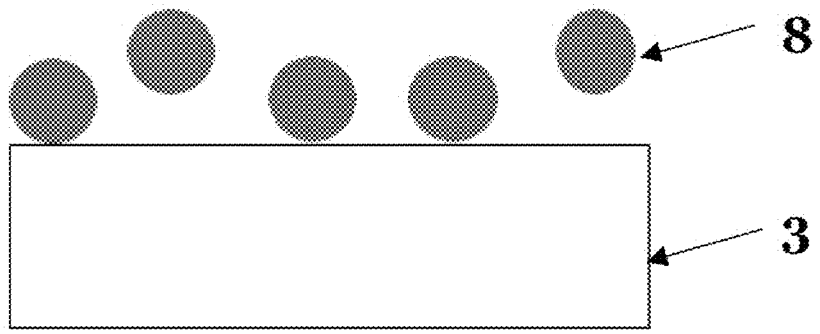

One example of adsorption characteristics of a contrast gas 8 is shown in FIGS. 3A and 3B. The contrast gas 8 may be chosen here such that it has an elevated affinity for adsorption on the second material 3 and shows only lower adsorption on the first material 2. Thus, the contrast gas 8 chosen can lead to an "artificial" relative increase in contrast of the signal at the transition of the etching operation on the first material 2 to the second material 3, for example in the signal of backscattered and/or secondary particles monitored during the etching operation. This can enable more precise endpointing during the repair operation on a lithography mask. Although it is not shown, it is of course also possible for precursor gas to be present in the atmosphere above the first material 2 and/or the second material 3. This can likewise be adsorbed on the surface of the first material 2 and/or of the second material 3, in which case the absorption characteristics may vary. In these cases too, the contrast gas 8 may be chosen such that it has an elevated affinity for adsorption on the second material 3 and shows only lower adsorption on the first material 2. It is thus possible for the chosen contrast gas 8 to contribute to an "artificial" relative increase in contrast, even if precursor gas 10 is present.

Figure 4A:
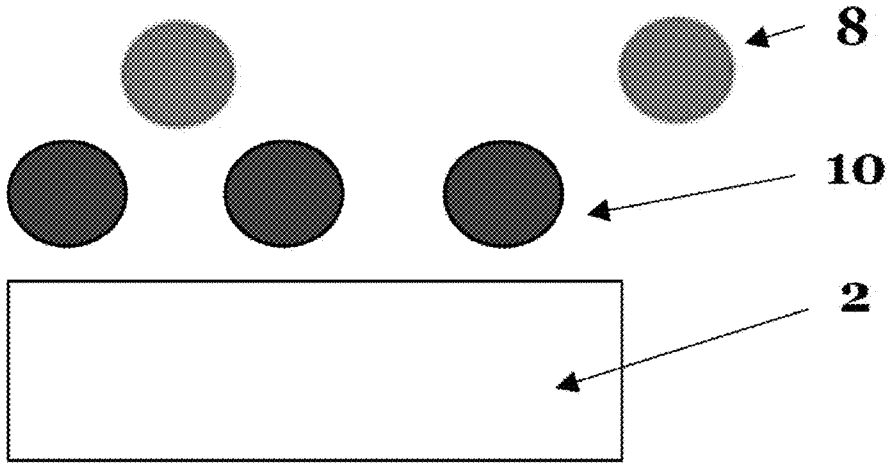
FIGS. 4A-4B example of adsorption characteristics of a contrast gas and a precursor gas.
Figure 4B:
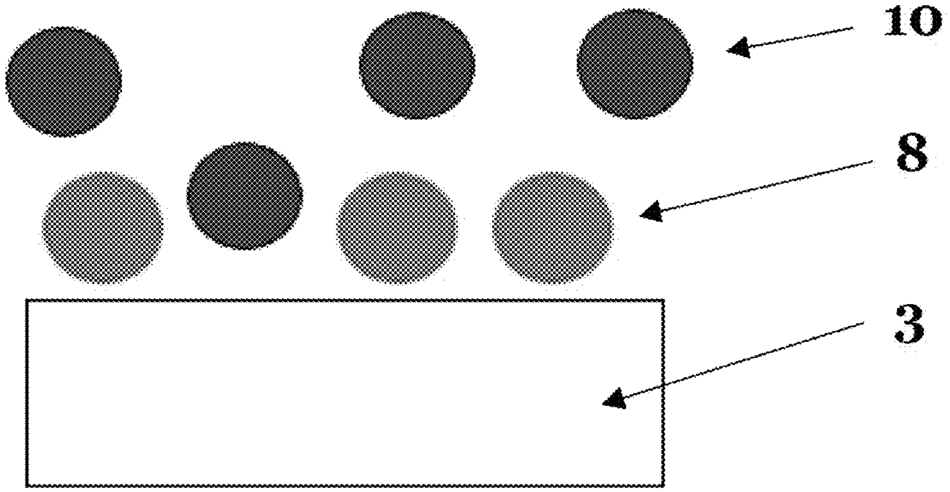

FIGS. 4A and 4B show an example of the absorption characteristics of a contrast gas 8 and an additional precursor gas 10. FIG. 4A shows the case in which the first material 2 is exposed both to the contrast gas 8 and to the precursor gas 10. The contrast gas 8 may be selected such that it is adsorbed onto the first material 2 to a lesser degree than the precursor gas 10, for example such that it has a lower affinity for the first material 2 than the precursor gas 10. This can contribute to a lesser degree of influence by the contrast gas 8 on the etching process on the first material 2.

FIG. 4B shows a situation in which the second material 3 is exposed to the precursor gas 10 and the contrast gas 8. The contrast gas 8 may be selected such that it has a higher affinity for the second material 3 than for the first material 2. It can thus be adsorbed to a higher degree onto the second material 3 than onto the first material 2. Alternatively or additionally, the precursor gas 10 may be selected such that it has a higher affinity for the first material 2 than for the second material 3. The overall situation may arise that there is at first greater adsorption of the precursor gas 10 on the surface of the first material 2 (FIG. 4A) and at least partial displacement of the precursor gas 10 from the second material 3 by the contrast gas 8 at the transition of the etching operation to the second material 3.

Alternatively or additionally, the contrast gas 8 and the precursor gas 10 may be chosen such that the contrast gas 8 is more significantly adsorbed onto the second material 3 compared to the precursor gas 10. In this way too, at the transition of the etching operation to the second material 3, there may be at least partial displacement of the precursor gas 10 by the second material 3.

The ratio of coverage of the surface of the second material 3 by a precursor gas 10 relative to a contrast gas 8 may be smaller than on the first material 2 (higher coverage is also conceivable, in which case it tends to be more desirable for the etching process to keep the coverage of the first material 2 with the precursor gas 10 high). Higher contrast (for example with regard to the EsB and/or SE signal) of the signal 5 observable during the etching operation may arise as a result of the contrast gas 8 itself and/or as a result of the interaction of the contrast gas 8 with the second material 3.

A likewise conceivable case is that in which the precursor gas 10 is not adsorbed significantly onto the first material 2 or onto the second material 3, but is instead to be found, for example, only in the atmosphere surrounding the two materials. It may be sufficient for a chosen contrast gas 8 to have a higher absorption rate (for example an average over time) and/or a longer dwell time on the second material 3 than on the first material 2. The absorption may result from processes such as physisorption and/or chemisorption and/or another process that results in adsorption.

More particularly, a chosen contrast gas 8 adsorbed on the surface of the second material 3 may generate a different contrast in the EsB signal and/or in the SE signal compared to the first material 2. This may result from generation of a stronger or weaker EsB signal compared to the second material 3 by the contrast gas 8 adsorbed on the surface of the second material 3. In addition, a stronger or weaker SE signal compared to the second material 3 may be generated by the contrast gas 8 adsorbed on the surface of the second material 3. Ultimately, it is alternatively or additionally possible for the contrast gas 8 adsorbed on the surface of the second material 3 to attenuate the EsB and/or SE signal emanating from the second material 3.

It is likewise conceivable that the contrast gas itself is not significantly adsorbed, but leads on average to altered occupation of the first or second material with the precursor gas.

Figure 5A:
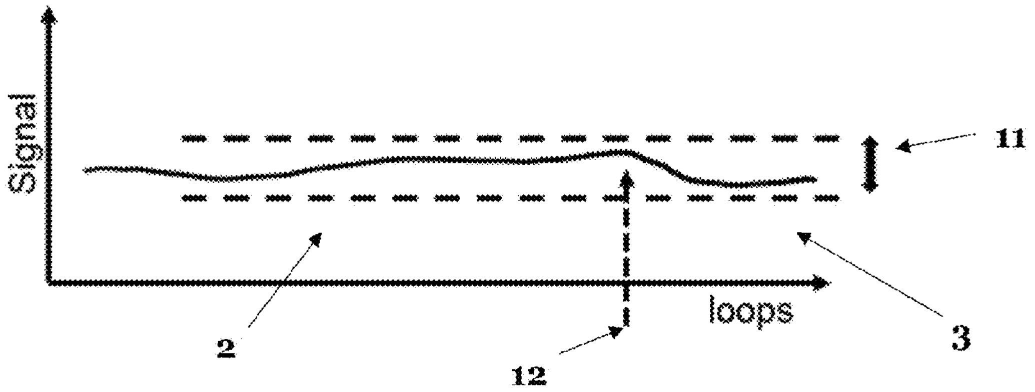
FIGS. 5A-5B illustrative diagram of the signal progression at a transition during a local etching operation in the absence and presence of a contrast gas.
Figure 5B:
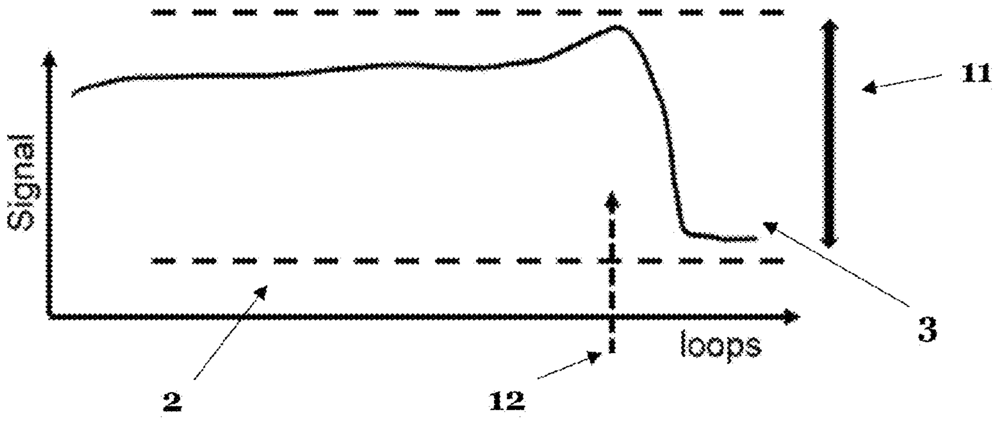

FIGS. 5A and 5B show the possible effect of determining whether a local etching operation on the first material 2 has already transitioned to an etching operation on the second material 3 beneath the first material 2, in the absence of a contrast gas 8 (FIG. 5A) and in the presence of a contrast gas 8 (FIG. 5B).

FIG. 5A shows a possible detectable signal composed of backscatter particles and/or secondary particles or another free-space signal generated by the etching operation, plotted against a number of etching operations (e.g. time). Reference numeral 2 in this connection indicates that the detectable signal is associated with a local etching operation on the first material 2 before the transition 12 of the etching operation from the first material 2 to the second material 3. As apparent from FIG. 5A, this may be associated with a change in signal 11. In the present example, the change in signal 11 comprises a decrease in the signal. However, it is pointed out that this should be understood merely by way of example, and an increase in the signal at the transition 12 is also possible. A transition 12 may be assumed here when the change in signal 11 exceeds a predetermined critical threshold value, i.e. when: Δsignal>threshold value. In FIG. 5A, the threshold value is smaller or comparable to the noise in the signal detected. There is therefore low contrast. This may occur especially when the changes in signal to the expected are regarded as small relative to the expected noise level or comparable thereto.

FIG. 5B is of identical construction to FIG. 5A, except that it shows, by way of example, the effect on the detectable signal when the local etching operation is supplied with a contrast gas 8. This leads, in the present case, to a more marked change in signal 11 in the detectable signal (in this example a decrease in signal) at the transition 12 than shown, for example, in FIG. 5A. This enables more precise determination of the transition 12 and hence more exact endpointing of a local etching operation. It is pointed out that the presence of a contrast gas 8 can also lead to an increase in the detectable signal at the transition 8.

What is claimed is:

1. A method of repairing a defect of a lithography mask, comprising:

a. directing a particle beam onto the defect to induce a local etching operation on the defect, b. monitoring the etching operation using backscattered particles and/or secondary particles and/or any other free-space signal generated by the etching operation, in order to detect a transition from the local etching operation on the defect to a local etching operation on an element of the mask beneath the defect, and c. feeding in at least one predetermined gas in order to increase contrast in the detection of the transition.

2. The method of claim 1, further including selection of the predetermined gas such that an adsorption rate and/or dwell time of the predetermined gas on the material of the element beneath the defect is higher than an adsorption rate or dwell time of the predetermined gas on a material of the defect.

3. The method of claim 1, wherein the degree to which the predetermined gas influences the backscatter of particles and/or generation of secondary particles and/or the other free-space signal generated by the etching operation on a material of the defect is different from that on a material of the element beneath.

4. The method of claim 1, wherein incidence of the particle beam on the predetermined gas results in backscatter of particles and/or generation of secondary particles.

5. The method of claim 1, wherein the predetermined gas is an inert gas.

6. The method of claim 1, wherein the predetermined gas is fed in in at least two separate intervals.

7. The method of claim 1, wherein the predetermined gas is fed in after the etching operation has commenced, preferably only shortly before the expected transition from the etching operation on the defect to the etching operation on the element of the mask beneath the defect.

8. The method of claim 1, further comprising:

inducing the local etching operation in absence of the predetermined gas;

feeding in the predetermined gas only after a predetermined expected progression of etching has been attained; wherein the etching operation is monitored only after the predetermined gas has been fed in.

9. The method of claim 1, comprising:

feeding in a precursor gas for the etching operation.

10. The method of claim 9, wherein the predetermined gas is fed in after the precursor gas has been fed in.

11. The method of claim 9, wherein the precursor gas influences the backscatter of particles and/or generation of secondary particles on a material of the defect and/or on a material of the element beneath.

12. The method of claim 9, further including selection of the predetermined gas in such a way that it displaces the precursor gas on a material of the element beneath, preferably to a greater extent than on a material of the defect.

13. A non-transitory computer readable medium storing a computer program with instructions which, when executed, cause a computer to perform a method of repairing a defect of a lithography mask, the method including:

directing a particle beam onto the defect to induce a local etching operation on the defect, monitoring the etching operation using backscattered particles and/or secondary particles and/or any other free-space signal generated by the etching operation, in order to detect a transition from the local etching operation on the defect to a local etching operation on an element of the mask beneath the defect, and feeding in at least one predetermined gas in order to increase contrast in the detection of the transition.

14. An apparatus for repairing a defect on a lithography mask, comprising:

a. means of directing a particle beam onto the defect to induce an etching operation on the defect, b. means of monitoring the etching operation using backscattered particles and/or secondary particles and/or another free-space signal generated by the etching operation, in order to detect a transition from the etching operation on the defect to an etching operation on an element of the mask beneath the defect, c. means of feeding in at least one predetermined gas in order to increase contrast in the detection of the transition.

15. An apparatus for repairing a defect in a lithography material, the apparatus comprising a non-transitory machine readable medium storing a program with instructions which, when executed, cause the apparatus to perform a method of repairing a defect of a lithography mask, the method including:

directing a particle beam onto the defect to induce a local etching operation on the defect, monitoring the etching operation using backscattered particles and/or secondary particles and/or any other free-space signal generated by the etching operation, in order to detect a transition from the local etching operation on the defect to a local etching operation on an element of the mask beneath the defect, and feeding in at least one predetermined gas in order to increase contrast in the detection of the transition.

16. The apparatus of claim 15, wherein the program further comprises instructions which, when executed, cause the apparatus to perform: selection of the predetermined gas such that an adsorption rate and/or dwell time of the predetermined gas on the material of the element beneath the defect is higher than an adsorption rate or dwell time of the predetermined gas on a material of the defect.

17. The apparatus of claim 15, wherein the program further comprises instructions which, when executed, cause the apparatus to perform the method such that the degree to which the predetermined gas influences the backscatter of particles and/or generation of secondary particles and/or the other free-space signal generated by the etching operation on a material of the defect is different from that on a material of the element beneath.

18. The apparatus of claim 15, wherein the program further comprises instructions which, when executed, cause the apparatus to perform the method such that incidence of the particle beam on the predetermined gas results in backscatter of particles and/or generation of secondary particles.

19. The apparatus of claim 15, wherein the program further comprises instructions which, when executed, cause the apparatus to perform the method with the predetermined gas being an inert gas.

20. The apparatus of claim 15, wherein the program further comprises instructions which, when executed, cause the apparatus to perform the method such that the predetermined gas is fed in in at least two separate intervals.

* * * * *